United States Patent [19]

Nixon

[11] 4,365,511
[45] Dec. 28, 1982

[54] DATA RATE GENERATOR
[75] Inventor: John M. Nixon, Bedford, Tex.
[73] Assignee: Edo-Aire Mitchell, Mineral Wells, Tex.
[21] Appl. No.: 222,993
[22] Filed: Jan. 6, 1981
[51] Int. Cl.³ .......................... G01L 7/00; G01C 21/00
[52] U.S. Cl. ...................................... 73/384; 364/433
[58] Field of Search ................. 73/384, 386, 701, 711; 364/433

[56] References Cited
U.S. PATENT DOCUMENTS
4,135,403 1/1979 Skarvada .............................. 73/384

Primary Examiner—Donald O. Woodiel
Attorney, Agent, or Firm—Richards, Harris & Medlock

[57] ABSTRACT

A signal varying over a wide dynamic range from a source (10) is input to a summing amplifier (12) along with the output of an adjustable reference generator (14). An error signal output of the summing amplifier (12), a subtraction of the output of the reference generator (14) from the input signal source (10), is applied to a rate network consisting of a capacitor (16) and a resistor (18), with the latter in a feedback loop for an amplifier (20). The output of the reference generator (14) is adjusted to maintain the error signal within the operating limits of the summing amplifier (12) by monitoring the output of the amplifier. During the time interval when the adjustment of the generator (14) is made, a compensating network (24) maintains the output of the amplifier (20) at the level previous to the adjustment interval. This provides a continuous output voltage at a terminal (22) that varies over an expanded range with reference to the input signal.

10 Claims, 3 Drawing Figures

DATA RATE GENERATOR

TECHNICAL FIELD

This invention relates to a circuit for expanding the range of signal variation, and more particularly to a circuit for providing an output varying over an expanded range with reference to an input signal.

BACKGROUND OF THE INVENTION

Although not restricted thereto, the invention has utility in the control of aircraft in flight and particularly the control of aircraft in altitude variation. An altitude signal may, for example, change 40 millivolts per minute for a 400 foot per minute change in altitude. Assuming an aircraft can fly to 40,000 feet, then the total change of voltage with altitude will be 4 volts. To emphasize the problem of control of an aircraft having a 40,000 foot altitude limitation, the 40 millivolts per minute is equal to 0.00067 volts per second. It is recognized that this is an extremely small change for a 1 second time interval considering the change in altitude that an aircraft can achieve in a 1 second interval. This same problem of a very small incremental change for a unit of time is also present in other control situations where the controlled variable has the potential of changing over an extremely wide range.

Early attempts to deal with this problem utilized a simple rate network connected to the output of an amplifier. This circuit generates a rate signal at the output of the amplifier that varies with changes of an input signal. Considering the example given above where the input voltage changes 4 millivolts per minute or 0.00067 volts per second, and that a reasonable output would be 1 volt for a 0.00067 volt per second input, then the time constant required by the rate network would be equal to approximately 1500 seconds. A capacitor required to produce such a time constant in a rate network is impractical, but more importantly the time required for the rate circuit to initially stabilize would be several times the 1500 second time constant and could reasonably be 4500 seconds. That is, it would take 4500 seconds for the rate network circuit to achieve some semblance of stability for an initial input signal which, and particularly in aircraft control, is an unacceptable stabalizing time interval. Note that the component that has to initially stabilize when the circuit is first turned on is the voltage across the capacitor C in the expression:

$$V_{out} = (RC)(\Delta V_{in}/SEC)$$

In addition to a long initial stabilization time, a rate network operating as discussed above would require resistor components that are very unstable with temperature and further are costly. Also, for the rate network to be accurate, the leakage current of the capacitor element must be very low which again is an expensive item considering the size of the capacitor required. Thus, heretofore to provide an acceptable signal that changes over a wide dynamic range, a circuit with a long time constant was required having a capacitor with very low leakage characteristics. The rate network approach to expanding a signal that varies over a wide dynamic range has thus proven impractical.

With reference particularly to aircraft control, the rate network solution to the expansion of an input signal proved unacceptable considering that aircraft often fly through turbulent air conditions where an input signal relating to altitude may take on the characteristics of a step input. A step input change to a rate network with a long time constant would mean the aircraft could not be controlled until the circuit re-stabilized after saturating. In a rate network system in an aircraft air data application, normal system noise and turbulance could keep the rate network almost constantly in a state of non-linear, saturated operation, or recovery from a non-linear state. This would effectively make the resulting output signals useless.

DISCLOSURE OF THE INVENTION

In accordance with the present invention there is provided a circuit for expanding the dynamic range of an input signal by comparing the input signal to an adjustable reference and applying the difference to a rate amplifier. The reference is adjusted as the input signal varies thereby enabling the use of a rate network with a reasonable time constant. The components of the RC network have values that are economically available in the marketplace.

What has been achieved in effect is that by means of the adjustable reference the value of the original signal is subtracted out resulting in an error signal. The rate network amplifier responds only to a change of the input signal about the reference. Assuming an amplification factor of 100, then the time constant for the rate network circuit, for the example given above, is reduced from 1500 seconds to 15 seconds. Thus, an advantage of the present invention is to provide an expanded range output signal for an input signal in a circuit with reasonable time constants. Further, for a signal that varies over a large dynamic range the output signal can be maintained within reasonable limits without the need for high voltage power supplies.

Further in accordance with the present invention, there is provided a circuit for expanding the range of an input signal where the circuit includes an adjustable reference source generating an output at discrete levels in accordance with the input signal. The output of the adjustable reference source is summed with the input signal to generate an error signal at the output of the summing network. This output is applied to an amplifier that includes a rate network with a capacitor connected to the output of the summer and a resistor connected as a feedback loop. The amplifier generates an output varying proportionally with the input signal change over an expanded scale, that is, a rate of change.

BRIEF DESCRIPTION OF THE DRAWINGS

A more complete understanding of the invention may be understood by reference to the following detailed description when considered in conjunction with the drawings.

Referring to the drawings.

DETAILED DESCRIPTION

Figure 1:
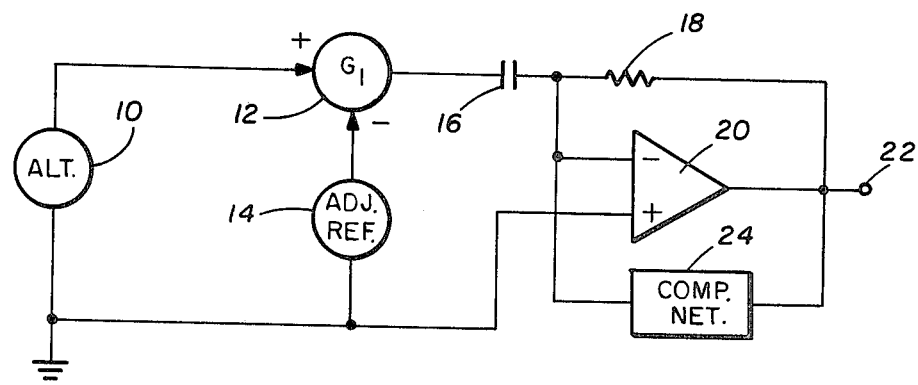
FIG. 1 is a schematic illustrating a basic circuit for expanding the scale of an input signal having a wide dynamic range.

Referring to FIG. 1 the invention will be described with reference to an application to aircraft control, and more particularly to altitude or vertical speed control. An input signal varying with altitude is generated at a source 10 and applied to one input of a summing amplifier 12. A typical altitude signal is continuous and varies linearly as a function of altitude and, as discussed previously, may vary at a rate of 0 to 5,000 feet per minute and have a dynamic range from 0 to up to 40,000 feet. This signal is compared with an adjustable reference applied to a second input of the summing gain amplifier 12. This adjustable reference signal is generated at the output of a reference generator 14 and varies over the same range as the input signal applied to the first input of the amplifier 12.

An output signal from the amplifier 12, which is equal to the error signal between the two inputs connected thereto, is applied to a rate network including a capacitor 16 and a resistor 18, with the latter in a feedback loop for an amplifier 20. By comparing the input signal with the reference signal in the amplifier 12, the error is increased by the gain of the amplifier. This error signal is applied to the rate network that produces a rate of change output signal at a terminal 22. Because of the comparison to produce an error signal and the amplification of the error signal by the amplifier 12, reasonable values are posible for the capacitor 16 and the resistor 18 included in the rate network. The rate network will have acceptable temperature stability and a capacitor with acceptable leakage current characteristics, all reasonably priced. Thus, the problem as discussed earlier where a rate network is used for slowly varying input signals is overcome.

Although the effective rate of change by the input signal at the output of the amplifier 20 is increased by the gain of the amplifier 12, if the adjustable reference source is held at a fixed output, the amplifier 12 will soon saturate due to movement of the input signal 10 thereby resulting in an output signal at the terminal 22 that is no longer tracking or proportional to the rate of change of the input signal from the source 10. Thus, the reference generator 14 is made adjustable to periodically vary the reference signal applied to the gain amplifier 12. This adjustment is made prior to the amplifier 12 saturating, thus enabling the output thereof to change continuously over the entire dynamic range of the input signal. However, it should be realized that for each change by the output of the reference generator 14 the stability of the rate network will be interrupted. To correct for this interruption a compensating circuit 24 is connected to the amplifier 20. The compensating circuit 24 enables the output at the terminal 22 to vary continuously with the input signal without interruption during the change of the output of the reference generator 14.

In operation of the circuit of FIG. 1, the summation of the two inputs to the amplifier 12 produces an error signal which, in effect, is a subtraction of the output of the reference generator 14 from the input signal from the source 10. The difference between the subtraction can be maintained within a reasonable signal range and conveniently amplified by the amplifier 20 connected to the rate network of the capacitor 16 and resistor 18. By means of a compensating network 24, the output at the terminal 22 will be continuously variable with the input signal and over an expanded range.

Figure 2:
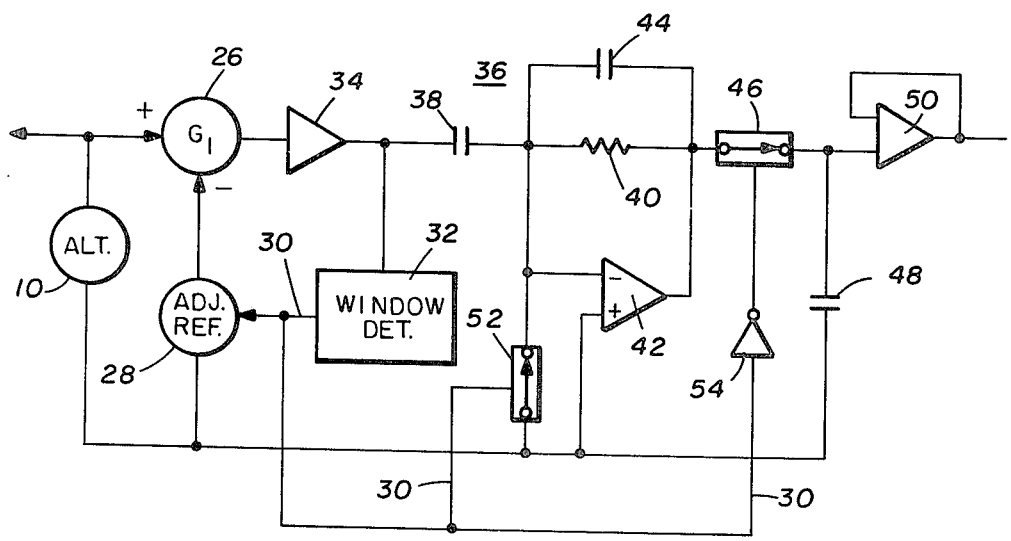
FIG. 2 is a block diagram of a preferred embodiment of the present invention for monitoring and automatically adjusting a reference signal and a circuit for expanding the scale of an input signal.

Referring to FIG. 2, in a practical application of the circuit of the present invention for control of an aircraft in altitude, the reference generator will be automatically adjusted as the aircraft increases or decreases its altitude position. Again, an altitude signal is output from the source 10 and applied to a summing junction 26 that has a second input from an automatically adjustable reference generator 28. The output of the reference generator 28 is changed by a control signal on a line 30, that is, an output of a window detector 32.

The output of the summing junction 26, an error signal, is input to an amplifier 34 having an output connected to a rate network 36 and the window detector 32. Operationally, the window detector 32 monitors the output of the amplifier 34 for predetermined limits of the error signal to generate control signals on the line 30 to adjust the reference generator 28. Thus, as the output of the amplifier 34 approaches either its upper or lower limits prior to saturation, the window detector 32 inputs a control signal to a generator 28 to provide a new reference signal to the summing junction 26. The window detector 32 performs the adjustment that was made manually by the circuit of FIG. 1.

An error signal from the amplifier 34 is applied to the rate network 36 consisting of a capacitor 38 and a resistor 40 in the feedback loop of an operational amplifier 42. Also included as part of the feedback loop is a capacitor 44 in parallel with the resistor 40. An output of the amplifier 42 is applied through a switch 46 to a sample and hold circuit including a capacitor 48 and an output amplifier 50. The voltage across the capacitor 48 and the output of the amplifier 50 is a signal that varies proportionally with the input signal change from the source 10 over an expanded range.

Also connected to the input of the amplifier 42 is a switch 52 that receives a control signal from the window detector 32 on the line 30. This control signal is also applied to an inverter amplifier 54 as a control for the switch 46. The switches 46 and 52, along with the amplifier 54 and the capacitor 48, comprise the compensating network 24 of FIG. 1.

In operation of the compensating circuit, the window detector 32 responds to the output of the amplifier 34 to generate a control signal on a line 30 to change the output of the reference generator 28. During the period of time that this control signal is available, the switch 52 is closed and switch 46 opened. This disconnects the output of the amplifier 42 from the capacitor 48 which has been charged to a voltage level by the output of the amplifier 42 before opening the switch 46. This voltage on the capacitor 48 is now circuit output signal as generated by the amplifier 50. During a change in the output of the reference generator 28, the output of the amplifier 42 is disconnected from the amplifier 50 and the capacitor 48 to maintain a continuous output from the amplifier 50.

With a change in the output of the reference generator 28, the output of the amplifier 34 will be driven to a new level. The difference between the input signal and the new output reference generator 28 is applied to the capacitor 38. During the period of time that a control signal is output from the detector 32, the capacitor 38 is connected to ground through the now closed switch 52 thereby enabling a rapid charge buildup. After a time calculated to stabilize the charging of the capacitor 38 to a level reflecting the updated output of the amplifier 34, the control signal on the line 30 is turned off thereby opening the switch 52 and closing the switch 46. The output of the amplifier 42, which has been stabilized rapidly by operation of the switch 52 is again applied to the capacitor 48 at the same level as before generation of the control signal on the line 30 for a constant rate of change of the input signal.

By operation of window detector 32 to monitor the output of the amplifier 34, both in a positive direction and in a negative direction, the error signal from the summing junction 26 is maintained within operating limits of the amplifier 34. The output of the circuit of FIG. 2 as generated by the amplifier 50 is continuous and varies with the input signal rate of change over an expanded input signal range.

Figure 3:
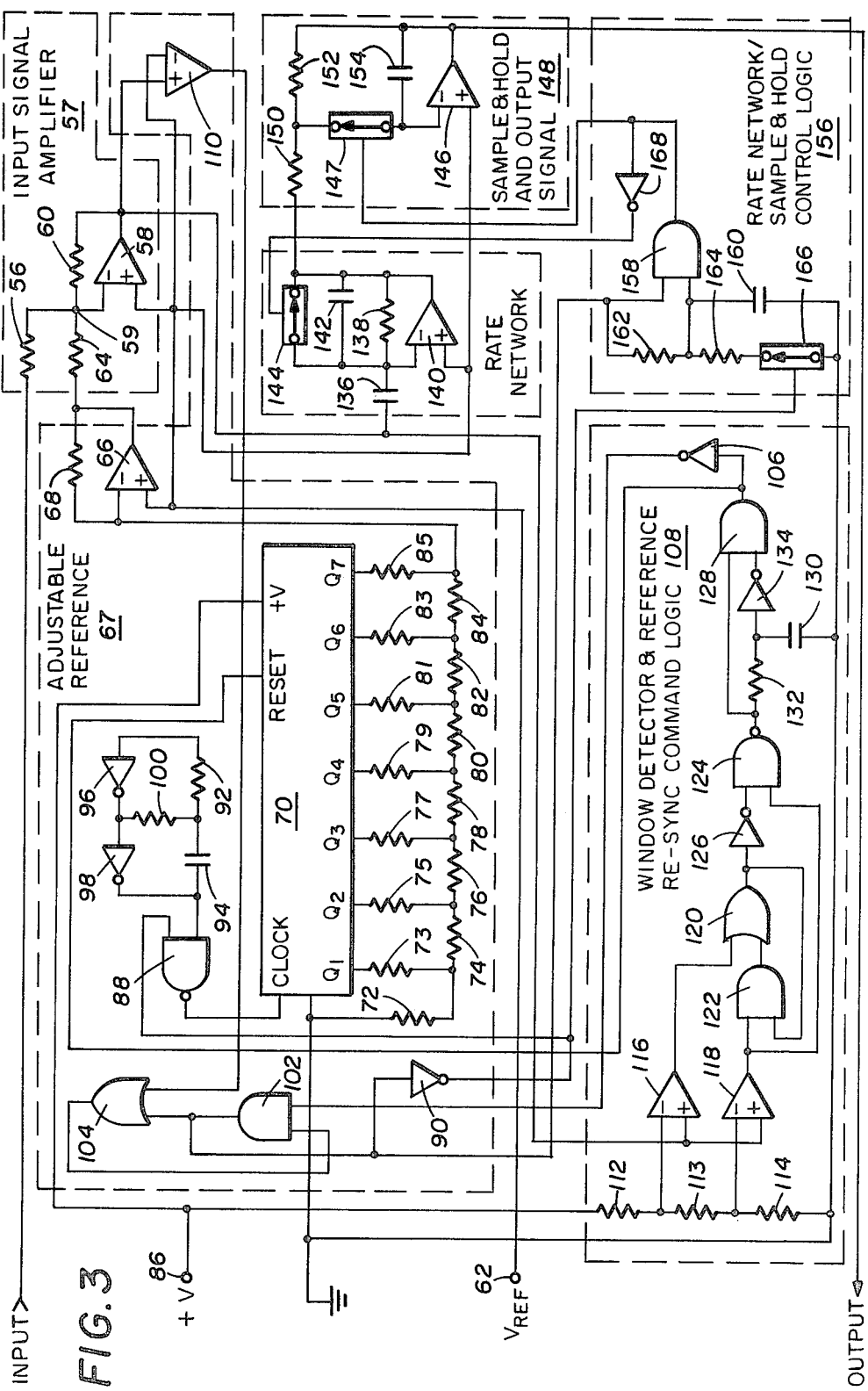
FIG. 3 is a detailed schematic of the embodiment of the invention illustrated in block form in FIG. 2.

Referring to FIG. 3, an error signal, for example a signal varying with altitude, is input through a summing resistor 56 to one input of a differential amplifier 58 as a part of a signal amplifier 57. The amplifier 58 and the summing junction 59 correspond to the summing junction 26 and the amplifier 34 of FIG. 2. Included within the circuit for the signal amplifier 57 is a feedback resistor 60 for the differential amplifier 58. A second input to the amplifier 58 is a reference voltage applied at an input terminal 62.

A second input applied to the summing junction 59 through a summing resistor 64 is an adjustable reference voltage as generated at the output of the reference generator 28 of FIG. 2. The reference voltage subtracted from the error signal at the junction 59 is the output of an inverting amplifier 66 having a feedback consisting of a resistor 68. A second input to the amplifier 66 is the reference voltage on terminal 62.

Also included as part of the adjustable reference 67 of FIG. 3 is a 7-bit ripple counter 70 connected to a ladder network consisting of resistors 72 through 85 with the interconnection of the resistors 84 and 85 connected to the inverting input of the amplifier 66. The 7-bit ripple counter 70 is driven by a voltage supply applied to a terminal 86 with clock pulses applied to the counter from the output of a NAND gate 88. Clock pulses are output from the NAND gate 88 only when an enabling pulse is applied to the NAND gate from the output of an inverting amplifier 90. Clock pulses input to the NAND gate 88 are generated by an oscillator including an RC circuit consisting of a resistor 92 and a capacitor 94 with the resistor connected to an output of an inverting amplifier 96 and the capacitor connected to the output of an inverting amplifier 98. Interconnected to the two inverting amplifiers is a resistor 100 that also connects to the resistor 92 and the capacitor 94. An output of the oscillator is applied to the second input of the NAND gate 88 and it is these clock pulses that are input to the 7-bit ripple counter 70 for adjusting the output of the adjustable reference 67.

The enable signal at the output of the inverter amplifier 90 is the inversion of an end-of-conversion pulse that is generated by a run/stop latch consisting of an AND gate 102 and an OR gate 104. A reset pulse applied to one input of the AND gate 102 is generated by an inverting amplifier 106 as part of a window detector 108 that also includes reference re-sync command logic, as will be explained.

Also included as part of the adjustable reference 67 is a comparator amplifier 110 that compares the output of the amplifier 58 with the reference voltage applied to the terminal 62. The comparator 110 generates a pulse to set the run/stop latch as part of the adjustable reference.

In operation of the adjustable reference 67, when the output of the AND gate 102 of the run/stop latch is logic high, the adjustable reference output at the amplifier 66 has been synchronized with the input signal; that is, the voltage at the output of the inverting amplifier 66 is approximately equal to the input signal resulting in a near null voltage condition at the summing junction 59. At the end of a conversion cycle, the amplifier 90 generates a logic low that is input to the NAND gate 88 thereby disenabling this gate to block clock pulse from the 7-bit ripple counter 70. The output voltage from the resistor ladder network will now hold at the last count of the counter 70 when the NAND gate 88 was disabled. The reference voltage at the output of the adjustable reference will be determined by the ratio of the summing resistors 56 and 64.

To start a conversion cycle, that is, the adjustment of the count at the output of the counter 70, a reset pulse from the output of the amplifier 106 is applied to the AND gate 102. At the same time, the signal input to the amplifier 106 is applied to the reset terminal of the counter 70 thereby resetting the output of the counter to zero. The reset pulse to the AND gate 102 is a negative going voltage, that is, steps logic low, which resets the run/stop latch. This pulse is a millisecond or two long which is suffucient to reset the counter 70 and enable various circuit components to stabilize.

With the counter reset to zero, the output of the comparator 110 goes logic low. At the expiration of the reset pulse the output of the AND gate 102 is logic low which is inverted in the amplifier 90 to enable the NAND gate 88 to input clock pulses to the counter 70 which now counts up generating a reference signal at the summing junction 59. This counting sequence continues until the output of the comparator 110 goes logic high thereby setting the run/stop latch and producing a logic high from the AND gate 102. This output of the AND gate 102 is inverted in the amplifier 90 to disable the NAND gate 88. A new reference voltage is output from the ladder network and applied through the inverting amplifier 66 to the summing resistor 64.

Generation of the reset pulse to the counter 70 and the AND gate 102 are provided by the window detector 108 which includes a resistance divider network consisting of resistors 112 through 114. Voltages generated by the divider network are input to a "set" comparator amplifier 116 and an "enable" comparator amplifier 118. An output of the comparator amplifier 116 is one input to an OR gate 120 having a second input from an AND gate 122. The input to the AND gate 122 is the output of the comparator amplifier 118. This output from the amplifier 118 is also input to a NAND gate 124 that triggers a single shot multivibrator as will be explained. A second input to each of the amplifiers 116 and 118 is the output of the amplifier 58.

As interconnected, the AND gate 122 and the OR gate 120 comprise a latch having an output applied through an inverter amplifier 126 to a second input of the NAND gate 124.

The comparator amplifiers 116 and 118 monitor the output of the amplifier 58 and compare it with reference voltages established by the divider network of resistors 112 through 114. When the output of the amplifier 58 is within the "window" voltage as established by the resistance divider, the output of the comparator amplifier 118 is logic high and the output of the comparator amplifier 116 is logic low. This produces a logic low at the output of the OR gate 120 which is inverted by the amplifier 126 such that both inputs to the NAND gate 124 are logic high. When the output of the amplifier 58 exceeds the "window" voltage limit established at the interconnection of the resistors 113 and 114, the output of the comparator amplifier 118 steps logic low. This causes one of the inputs to the NAND gate 124 to be logic low thereby generating an output transition. When the output of the amplifier 58 exceeds the "window" voltage limit in the opposite direction, the comparator amplifier 116 steps logic high to set the latch consisting of AND gate 122 and OR gate 102. Since the output of the amplifier 118 is already a logic high, the input to the NAND gate 124 from the amplifier 126 now steps low. The latch of OR gate 102 and AND gate 122 is now set by the output of the amplifier 116. Thus, the output of the amplifier 116 is identified as the "set" pulse for the latch and the output of the amplifier 118 is identified as the "enable" pulse.

The latch remains set even though the output of the amplifier 116 steps logic low. A logic low will be generated at the output of the amplifier 126 by operation of the latch in response to the amplifiers 116 and 118. A reset pulse is maintained during the sequence of enabling and setting the latch of AND gate 122 and OR gate 120.

When the output of the NAND gate 124 steps high, it triggers a one shot multivibrator consisting of an AND gate 128, an RC network of a capacitor 130 and a resistor 132, and an inverting amplifier 134. As the output of the NAND gate 124 steps logic high, the capacitor 130 is charged through the resistor 132. This charge voltage is inverted and input to an AND gate 128. With both inputs to the AND gate 128 logic high, a reset pulse is generated at the output of the AND gate 128 which is applied to the reset terminal of the 7-bit ripple counter 170 and the input of the inverting amplifier 106. As mentioned previously, the output of the amplifier 106 is the reset pulse to the run/stop latch of the adjustable reference generator 67.

By operation of the one shot multivibrator, the output transition from the NAND gate 124 causes only one pulse to be generated at the output of the AND gate 128. The length of this pulse is determined by the time constant of the RC network.

An output of the amplifier 58 is also input to a rate network including a capacitor 136 and a resistor 138. The resistor 138 is part of the feedback circuit for a differential amplifier 140 with the feedback circuit also including a capacitor 142. A second input to the amplifier 140 is tied to the reference voltage applied to the terminal 62. The time constant of the rate network is within acceptable limits because of the amplification gained by the amplifier 58. By addition of the capacitor 142, a roll off of the high frequency response is achieved by selecting the value of this capacitor to be some fraction of the value of the capacitor 136. By proper sizing, the capacitor 142 only introduces a minimum of time lag into the circuit.

The output of the amplifier 58 is monitored and the derivative thereof generated at the output of amplifier 140. However, during the resynchronization by the adjustable reference 67, the rate network must be effectively removed from the circuit. This is achieved by connecting an electronic switch 144 in the feedback loop for the amplifier 140. By closing the electronic switch 144 during the resetting and resynchronization of the adjustable reference 67, the time constant of the rate network is changed to permit rapid stabilization of the output of the amplifier 140. With the electronic switch closed, the time constant of the rate network is essentially determined by the value of the capacitor 136 and the resistance of the switch, which is relatively small. Thus, during the resynchronization of the adjustable reference 67, the output of the amplifier 140 is not meaningful data and cannot be effectively utilized.

During the time interval between adjustment of the reference 67, the output of the amplifier 140 is connected to the input of an amplifier 146 as part of a sample and hold circuit 148. This connection is made through an electronic switch 147 connected to the junction of an input resistor 150 and a feedback resistor 152. Also, included as a part of the circuit for the amplifier 146 is a holding capacitor 154.

When the switch 144 is open and the amplifier 140 functioning as a differentiator, the switch 147 is closed and the amplifier 146 generates an output varying in proportion to the rate of change of the input error signal applied to the amplifier 58 through resistor 56.

During resynchronization of the adjustable reference 67, when the amplifier 140 is not functioning as a differentiator, the switch 144 is closed. No meaningful data is output from the amplifier 140 at this time, and switch 147 is opened.

Functionally, when the switch 147 is open, the amplifier 146 and the capacitor 154 function as a sample and hold circuit producing an output at the same level before the switch 147 is opened. Basically, the amplifier 146 is a low pass filter with a frequency response determined by the capacitor 154 and a resistor 152. However, when the switch 147 is open the amplifier 146, as mentioned, functions as a hold circuit. The amplifier 146 and capacitor 154 continue to function as a hold circuit so long as the electronic switch 147 remains open.

Control of the electronic switches 144 and 147 is the function of control logic 156. The control logic 156 receives the end-of-conversion signal from the AND gate 102 which is applied directly to an AND gate 158 and to a time delay circuit including a timing capacitor 160 and a resistance network consisting of resistors 162 and 164, the latter in series with an electronic switch 166. The interconnection of the resistors 162 and 164, with the capacitor 170, is tied to a second input of the AND gate 158. An output of the AND gate 158 controls the electronic switch 147 directly and controls the electronic switch 144 through an inverting amplifier 168.

During resynchronization of the adjustable reference 67, both inputs to the AND gate 158 are logic low which steps the output of the gate 158 to logic low. This output of the AND gate 158 opens the electronic switch 147 and through the inverter amplifier 168 closes the electronic switch 144. After the resynchronization of the adjustable reference 67 has been completed, some time must elapse for stabilizing the rate network before opening the switch 144 and closing the switch 147. This delay is a function of the control logic 156 and is sufficient to establish a new voltage across the capacitor 136.

In operation of the control logic, when a conversion (or "re-sync") is initiated, the output of AND gate 102 goes from high to low. This action causes switch 166 to close and rapidly discharge capacitor 160 through resistor 164, and causes one input to AND gate 158 to go low. Also, the low output of AND gate 102 is connected to the other input of AND gate 158 with no time delay, and the output of gate 158 immediately goes low. This causes switch 147 to open and switch 144 to close.

At the end of conversion the output of AND gate 102 goes high, and one input to AND gate 158 is also now high. Further, switch 166 now opens and allows the output of AND gate 102 to charge capacitor 160 through resistor 162. However, until the capacitor 160 charges up to the threshold level of the input of AND gate 158, that input of the gate 158 is still a logic low and the output remains low. Once capacitor 160 has charged to a "high" logic level, both inputs to the gate 158 are high, and the output goes high. In so doing, switch 147 is closed, and switch 144 is opened.

In summary, the purpose of logic control 156 is to immediately open switch 147 and close switch 144 when a new conversion is initiated but delay the closing of switch 147 and opening of switch 144 for some amount of time following the completion of a conversion. This delay allows time for a new voltage to stabilize across the capacitor 136 before re-enabling the output of the differentiator circuit.

All during the conversion cycle, the switch 166 is closed to discharge the capacitor 160.

Operationally the circuit of FIG. 3 is similar to that of FIGS. 1 and 2. An input signal applied to the summing resistor 56 is compared with the reference voltage applied to the summing resistor 64 generating a difference or error signal at the summing junction 59. This error or difference signal is applied to the amplifier 58 having an output connected to the rate network consisting of the capacitor 136 and the resistor 138. The differentiated signal is input to the sample and hold circuit 148 to charge the capacitor 154 and provide an output from the amplifier 146 having a magnitude varying with the rate of change of the error signal.

As the input signal varies by some defined difference from the reference voltage the window detector responds the difference and generates a resynchronization and reset command to the adjustable reference 67. A new count is generated in the 7-bit ripple counter 70 by enabling the NAND gate 88 from the output of the run/stop latch. The conversion continues until the reference voltage applied to the resistor 64 is nearly equal or equal to the input signal applied to the resistor 56, that is, equal and opposite to the voltage reference. When these two signals reach a predetermined difference, the output of the comparator 110 shuts down the counter 70. The reference voltage has now been readjusted to a new level of input signal and the system is resynchronized for operation as a rate network. The new difference or error signal from the amplifier 58 is applied to the rate network with the switch 144 closed and the switch 147 open.

After timing out, the control logic 156 actuates the switch 144 to an open position and the switch 147 is closed to resume normal rate operation of the circuit. The rate of change signal from the amplifier 140 is input to the sample and hold circuit 148.

It will be understood that the scope of the present invention is not limited to the preferred embodiment described above, but is capable of numerous rearrangements, modifications and substitutions of parts and elements without departing from the scope of the present invention.

I claim:

1. A rate circuit for an input signal having a slowly varying amplitude, comprising:
    an adjustable reference source;
    means for summing an input signal with the output of said adjustable reference source to generate an error signal varying the difference therebetween;
    means for monitoring the amplitude of the error signal within predetermined limits;
    means for changing the output of said adjustable reference source when the error signal approaches a predetermined limit; and
    means including rate means connected to receive the error signal of said means for summing, said rate means generating an output having an amplitude varying with the input.

2. A rate circuit for an input signal having a slowly varying amplitude as set forth in claim 1 wherein said means for summing includes means for generating an amplified error signal.

3. A rate circuit for an input signal having a slowly varying amplitude as set forth in claim 1 wherein said input signal varies with aircraft altitude and said adjustable reference source includes means for generating a voltage varying with altitude to be summed with the altitude input signal.

4. A rate circuit for an input signal having a slowly varying amplitude as set forth in claim 1 wherein said rate means includes a capacitor and further including means for charging said capacitor during a change in the level of the output of said adjustable reference source to a changed level of error signal.

5. A rate circuit for an input signal having a slowly varying amplitude as set forth in claim 1 including a compensation circuit responsive to the output of said rate means to sample and hold the rate means output during a change in the output of said adjustable reference source.

6. A rate circuit for an input signal having a slowly varying amplitude, comprising:
    an adjustable reference source generating an output at discrete levels;
    means for summing the input signal with the output of said adjustable reference source to generate an error signal at the output thereof;
    means for monitoring the amplitude of the error signal within predetermined limits;
    means for changing the output of said adjustable reference source when the error signal approaches a predetermined limit; and
    means including means connected to receive the error signal of said means for summing, said means generating an output having an amplitude varying with the input.

7. A rate circuit for an input signal having a slowly varying amplitude as set forth in claim 6 including means connected to the output of said means including rate means and responsive to the output of said means for monitoring to sample and hold the output of said means including rate means during a change in the level of the output of said adjustable reference source.

8. A rate circuit for an input signal having a slowly varying amplitude as set forth in claim 6 wherein said rate means includes an amplifier and a capacitor in parallel with the feedback loop of said amplifier.

9. A rate circuit for an input signal having a slowly varying amplitude as set forth in claim 7 wherein said rate means includes an amplifier and said sample and hold circuit includes a switch connected to the output of said amplifier and a capacitor to said switch to connect said capacitor to said amplifier when in a closed position.

10. A rate circuit for an input signal having a slowly varying amplitude as set forth in claim 9 including means connected to the capacitor of said amplifier and responsive to the output of said means for monitoring to set the charge on said capacitor during a change in the level of the output of said adjustable reference source.

* * * * *